United States Patent [19]

Morgan

[11] 3,918,996

[45] Nov. 11, 1975

[54] FORMATION OF INTEGRATED CIRCUITS USING PROTON ENHANCED DIFFUSION

[75] Inventor: Ian H. Morgan, Richardson, Tex.

[73] Assignee: Texas Instruments Incorporated, Dallas, Tex.

[22] Filed: Mar. 1, 1973

[21] Appl. No.: 337,029

Related U.S. Application Data

[63] Continuation of Ser. No. 85,931, Nov. 2, 1970, abandoned.

[52] U.S. Cl. .................... 148/1.5; 148/187; 357/91

[51] Int. Cl. .................................... H01l 7/54

[58] Field of Search .................... 148/1.5, 188, 175

[56] References Cited

UNITED STATES PATENTS

| | | | |
|---|---|---|---|
| 3,327,182 | 6/1967 | Kisinko | 317/235 |
| 3,533,857 | 10/1970 | Mayer et al. | 148/1.5 |
| 3,562,022 | 2/1971 | Shifrin | 148/1.5 |
| 3,589,949 | 6/1971 | Nelson | 148/1.5 |
| 3,655,457 | 4/1972 | Duffy et al. | 148/1.5 |

OTHER PUBLICATIONS

Nelson et al., "Radiation-Enhanced Diffusion of Boron in Silicon" Applied Physics Letters, Vol. XV, No. 8, Oct. 15, 1967, pp. 246–248.

*Primary Examiner*—L. Dewayne Rutledge
*Assistant Examiner*—J. M. Davis
*Attorney, Agent, or Firm*—Harold Levine; James T. Comfort; William E. Hiller

[57] ABSTRACT

Disclosed is an improved method for forming an integrated circuit wherein deep diffusions of impurities into a semiconductor chip are accomplished at temperatures in the range of 400°–1000° C by bombarding the chip with low mass ions such as protons. Using a proton beam of suitable energy and current density the diffusion rate of impurities may be enhanced by several orders of magnitude from that obtained by thermal diffusion.

6 Claims, 15 Drawing Figures

INVENTOR
Ian H. Morgan

Richard L. Donaldson
WITNESS

BY Gary C. Honeycutt
ATTORNEY

FORMATION OF INTEGRATED CIRCUITS USING PROTON ENHANCED DIFFUSION

This is a continuation, of application Ser. No. 085,931, filed Nov. 2, 1970, now abandoned.

This invention relates to integrated circuits and more particularly to monolithic integrated circuits of the type having circuit components joined together by a common substrate but electrically isolated from one another throughout the substrate.

The increased use of microminiaturization has been reflected in the semiconductor field by the rapid development of integrated circuitry and particularly monolithic integrated circuitry. By monolithic integrated circuitry is meant the formation of individual active and/or passive circuit components for an electronic circuit in or on a single slice of semiconductor material, preferably single crystalline, the components being interconnected to form the desired circuit network. In such a circuit network it is necessary to electrically isolate the circuit components formed on the chip.

Various techniques have been developed for fabricating integrated circuits wherein the individual components are electrically isolated one from the other; for example, in one method an epitaxial layer of semiconductor material is formed upon the substrate and the discrete components are formed in the epitaxial layer. An isolation region is then formed by doping the area surrounding each device with an appropriate impurity. The device is then heated to an elevated temperature, generally around 1200°C, for a long period of time. The high temperature creates vacancies in the lattice structure of the epitaxial layer and thus enables the impurity to diffuse through the epitaxial layer and contact the substrate to form the isolation barrier. Several problems are associated with this method, however. First, in diffusing through the epitaxial layer, the dopant tends to diffuse in all directions. The lateral spreading of the dopant requires a larger area of the substrate slice for each device formed from that which would be required if the dopant diffused only in a vertical direction. Secondly, the high temperature required in order to enable the dopant to diffuse through the epitaxial layer introduces contaminative impurities (such as gold, copper, etc.) into the device and impairs its characteristics.

Ion implantation techniques have been utilized to dope semiconductor material, but such techniques require an extremely large amount of energy to accelerate the ions of the dopant. Thus, when deep diffusions are attempted the large amount of energy impinging on the slice of semiconductor material creates a thermal transfer problem, causing the slice to become heated to an unacceptable elevated temperature.

It is therefore one object of this invention to provide an improved method of enhancing diffusions in fabricating integrated circuits wherein the diffusion rate of the dopant is enhanced by bombarding the semiconductor chip with protons, or other low mass ions.

The invention is generally directed to a method of accomplishing diffusions, particularly of deep diffusions, in an integrated circuit at temperatures below 1000°C wherein doped regions of the semiconductor material are bombarded with protons thereby to enhance the rate of diffusion of the dopant into the semiconductor material. In forming a circuit element of an integrated circuit in accordance with the present invention, an epitaxial layer of semi-conductor material is deposited upon a single crystalline substrate of relatively high resistivity. Typically, the substrate has a resistivity in the range from 0.1 ohm-cm to 10 ohm-cm. The epitaxial layer is doped to be of opposite type conductivity from the substrate. A circuit element, such as, for example, a transistor, is then formed within the epitaxial layer. A portion of the surface of the epitaxial layer surrounding the circuit element thus formed is then doped with an impurity to make that region the same conductivity type as the substrate, thus in effect forming an isolation ring around the circuit element. The doped isolation region on the surface of the epitaxial layer is bombarded with protons to enhance diffusion of the dopant into the epitaxial layer. A proton beam is utilized of sufficient energy to enable the dopant to diffuse completely through the epitaxial layer so as to contact the substrate and thereby electrically isolate the circuit element from other circuit elements formed on the same substrate. The periphery of the continuous doped region forms an isolation ring having a boundary through the epitaxial layer that is substantially perpendicular to the surface of the epitaxial layer. Proton enhanced diffusion may be effected at temperatures substantially below 1000°C, thus avoiding the deleterious results associated with high temperature thermal diffusion.

The novel features believed to be characteristic of this invention are set forth with particularity in the appended claims. The invention itself, however, as well as further objects and advantages thereof may be best understood by reference to the following detailed description when read in conjunction with the appended claims and drawings wherein:

Figures 1, 2, 3:
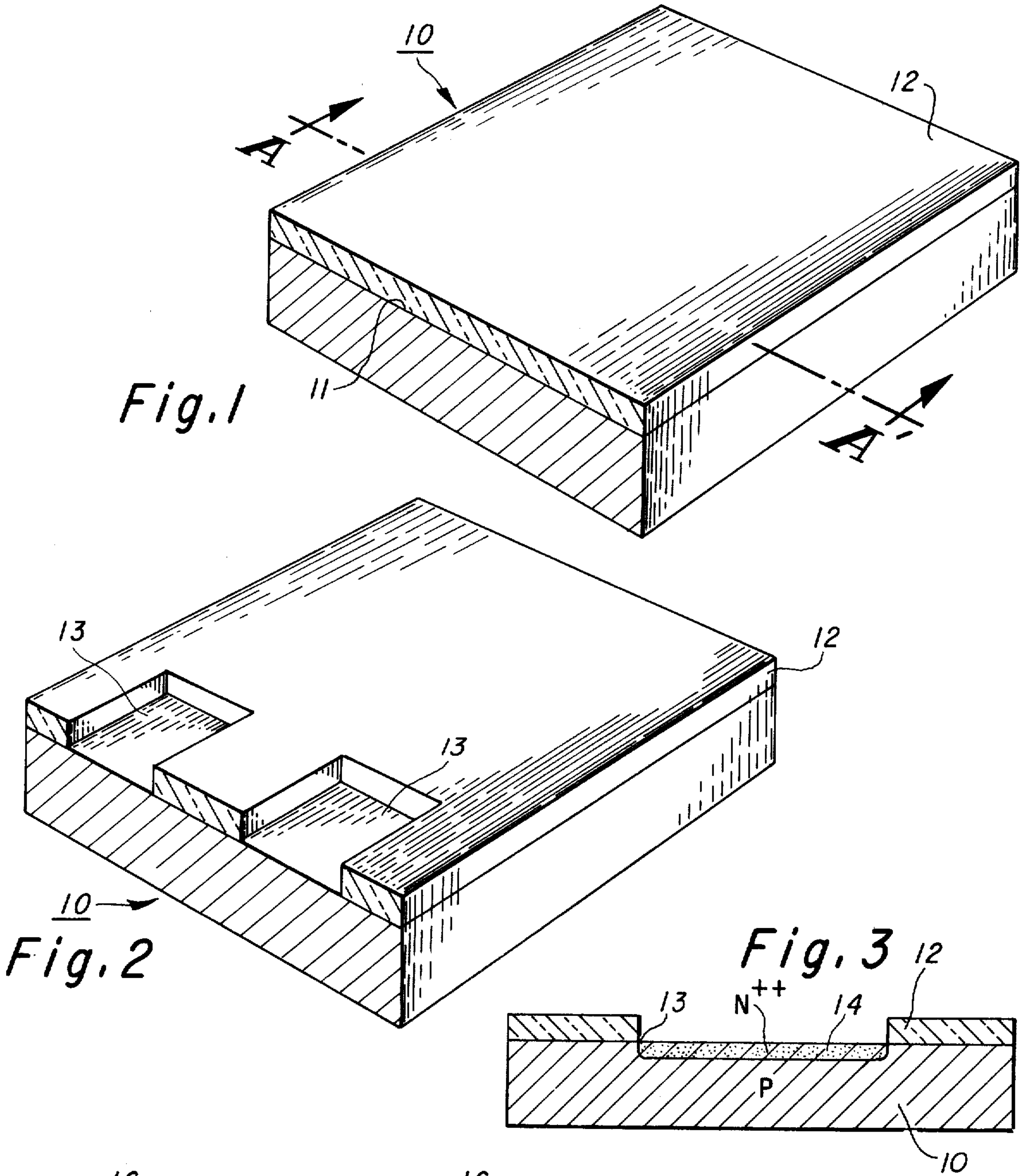
FIGS. 1 and 2 are pictorial views in section of a segment of a semiconductor slice in the early stages of production of an integrated circuit device in accordance with the process of this invention.
FIGS. 3–13 are sectional views of a portion of the slice taken along line A–A' of FIG. 1, illustrating steps during the formation of a device in accordance with the method of the present invention.

Referring now to FIG. 1, a segment of a slice of single crystal semiconductor material is used as a starting substrate. A starting slice may be approximately 2 inches in diameter and 10 mils thick. A small segment of the slice may be represented as the chip or bar 10 which represents the segment occupied by one integrated circuit. Actually the slice would contain dozens or even hundreds of the segments such as the chip 10. The top surface 11 of the slice is coated with a masking or insulating coating 12. This masking coating, for example, may comprise silicon oxide, which may be formed by any conventional technique to a thickness of about 10,000A. For example, when the semiconductor material is of silicon, the insulating coating 12 may be thermally grown by heating the silicon in the presence of oxygen.

Using conventional photographic masking and etching or electron beam patterning and etching techniques, a portion of the oxide layer 12 is removed to form windows 13 and 13 in the oxide layer 12 as shown in FIG. 2.

Referring now to FIGS. 3–13, the method of the present invention will be described as it pertains to forming an npn transistor on the chip 10 in the area of, for example, the window 13 cut in the oxide mask 12. The example shown in FIGS. 3–13 pertains to an npn transistor formed on a chip 10 having a p-type conductivity. It should be understood, of course, that if an n-type conductivity chip were utilized, a pnp transistor could be formed in accordance with the method shown in FIGS. 3–13 by using the appropriate dopants to effect regions of conductivity opposite from that depicted in the illustrative example shown in FIGS. 3–13. Also, the method of the present invention is not limited to forming a transistor on the semiconductor chip 10 of the integrated circuit. Resistors, diodes and other circuit elements that may be formed as a part of the integrated circuit could be electrically isolated one from another in accordance with the method of the present invention by appropriately doping a region of the semiconductor material overlying the chip 10 and surrounding the circuit element and then selectively bombarding this region with protons through a proton retarding mask to "drive-in" the impurities; that is, cause the impurities to diffuse deep into the semiconductor material and contact the chip to thereby form an isolation barrier around the circuit element.

Turning now specifically to FIG. 3, a p-type conductivity chip 10 is doped through window 13 in the oxide layer 12 to form a heavily doped n-type region 14 in said chip. For example, where the chip 10 is p-type silicon, the dopant used to form region 14 may be phosphorus, arsenic, or other dopants known to those skilled in the art that produces an n-type region in p-type conductivity silicon. The dopant may be introduced through window 13 by conventional thermal deposition diffusion techniques or by ion implantation. Typically the dopant region 14 extends into chip 10 a distance of about 0.25 to 0.50 $\mu$m, though this depth is in no way critical to the present invention.

Figure 4:
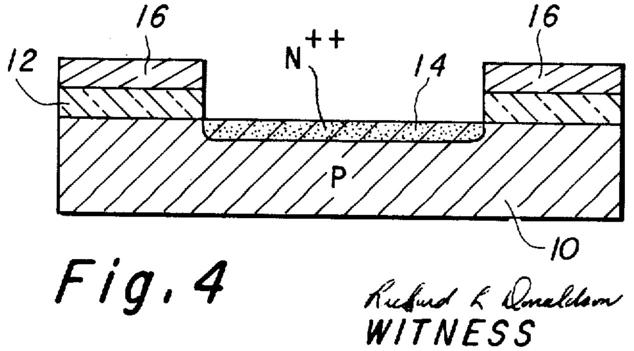

In FIG. 4 there is depicted a metal mask 16 formed over the oxide layer 12. A window is opened in the metal mask to expose the n-type conductivity region 14. The metal mask 16 may comprise, for example, aluminum, chromium, gold, or some other metal known to those skilled in the art to be effective in retarding proton penetration.

In the next step of the method for forming an npn transistor, the doped region 14 is bombarded with a beam of relatively low mass ions, such as protons, alpha particles and ions of inert gases; i.e., neon, argon, krypton and xenon. Preferably protons are utilized and therefore when referring to low mass ions hereinafter, these ions will be referenced as protons. The duration of proton bombardment is determined by the desired impurity concentration and proton beam current density. The metal film 16 prevents the proton beam H+, shown diagrammatically by the arrows in FIG. 5, from affecting other regions of the chip 10. The depth that the proton beam penetrates into the region of the chip 10 underlying doped region 14 is determined by the energy of the impinging proton beam and the orientation of the crystal lattice of the chip 10 with respect to the beam. When the proton beam impinges upon the region of the chip 10 underlying region 14, the protons collide with the nucleus of semiconductor material atoms, giving the nucleus sufficient energy to form a vacancy and an associated interstitial (a Frenkel defect). Since the proton has a small mass as compared to an impurity ion, only a point defect is caused in the semiconductor material lattice rather than the complex damage cluster that results when semiconductor material is bombarded with heavier dopant impurity ions. For example, when the semiconductor is silicon doped with boron, the protons displace silicon atoms from the crystal lattice structure, thereby producing a vacancy. The displaced silicon atoms become interstitial atoms; that is, atoms not bound to the lattice structure. These vacancies then diffuse through the lattice until they recombine. The diffusion of these vacancies enables impurity atoms in the region 14 to move from lattice site to lattice site in the semiconductor. Also, since most of the vacancies produced by the protons are located at a depth in the chip 10 that corresponds closely to the projected range of the protons which, as mentioned previously, is a function primarily of the energy of the protons, the depth of diffusion of the impurities may be controlled by selecting the proper energy for the proton beam. For example, with a proton beam accelerated by an energy of about 1 million electron volts, the protons will penetrate into the silicon chip 10 to a depth of about 9 $\mu$m.

At this juncture it should be noted that ion beam implantation of protons produces significant advantages over implantation of impurity ions, such as ions of boron. As mentioned earlier, the large mass of impurity ions, as compared with the mass of a proton, causes complex damage clusters when these ions are injected by a high energy source into a semiconductor material. More significantly, when the relatively large mass impurity ions are accelerated to a high energy level, the semiconductor material becomes heated to an unacceptably high temperature due to dissipation of a large amount of energy through the slice. For example, if boron ions are implanted into a silicon slice utilizing an ion beam current of about 100 $\mu A/cm^2$ with an energy of about 50 KEV, approximately 5 watts of energy must be dissipated by the slice. A 50 KEV energy level, however, produces a shallow implantation. An energy level of about 1 MEV with an ion beam current of about 100 $\mu A/cm^2$ produces an implantation to a depth of about 2.3 $\mu$m. The amount of energy that must be dissipated by the slice for this situation, however, is approximately 100 watts, which is an impractical power level that causes the slice to become excessively hot. Using proton enhanced diffusion, on the other hand, much less energy is required to achieve the same depth of doping. Thus, to dope silicon with boron to a depth of 2.3 $\mu$m, a proton beam of about 400 KEV, with a proton beam current density of about 2 $\mu$A is required. For this situation the slice must dissipate only 0.8 watts of energy, as contrasted with 100 watts for the ion implantation.

Again with reference to FIG. 5, region 14*a* depicts the region 14 after proton enhanced diffusion of the n-type impurities has taken place. As may be seen, region 14*a* extends into the chip 10 to a depth that is significantly larger than the depth of region 14. Further, it is to be noted that the periphery 15 of the proton enhanced impurity diffusion region 14*a* is substantially perpendicular to the surface 11 of the chip 10. That is, negligible lateral spread occurs during the deep diffusion step.

After the proton enhanced diffusion of region 14a, the metal mask 16 and the oxide layer 12 are removed by etching in accordance with techniques well known in the art. The surface 11 of the chip, including the doped region 14a, is then vapor etched with HCl to prepare the surface for epitaxial deposition. A thin film 18 of n-type conductivity semiconductor material is then grown overlying the surface 11 and doped region 14a. The device at this stage of fabrication is depicted in FIG. 6.

Figures 5, 6, 7, 8, 9, 10:
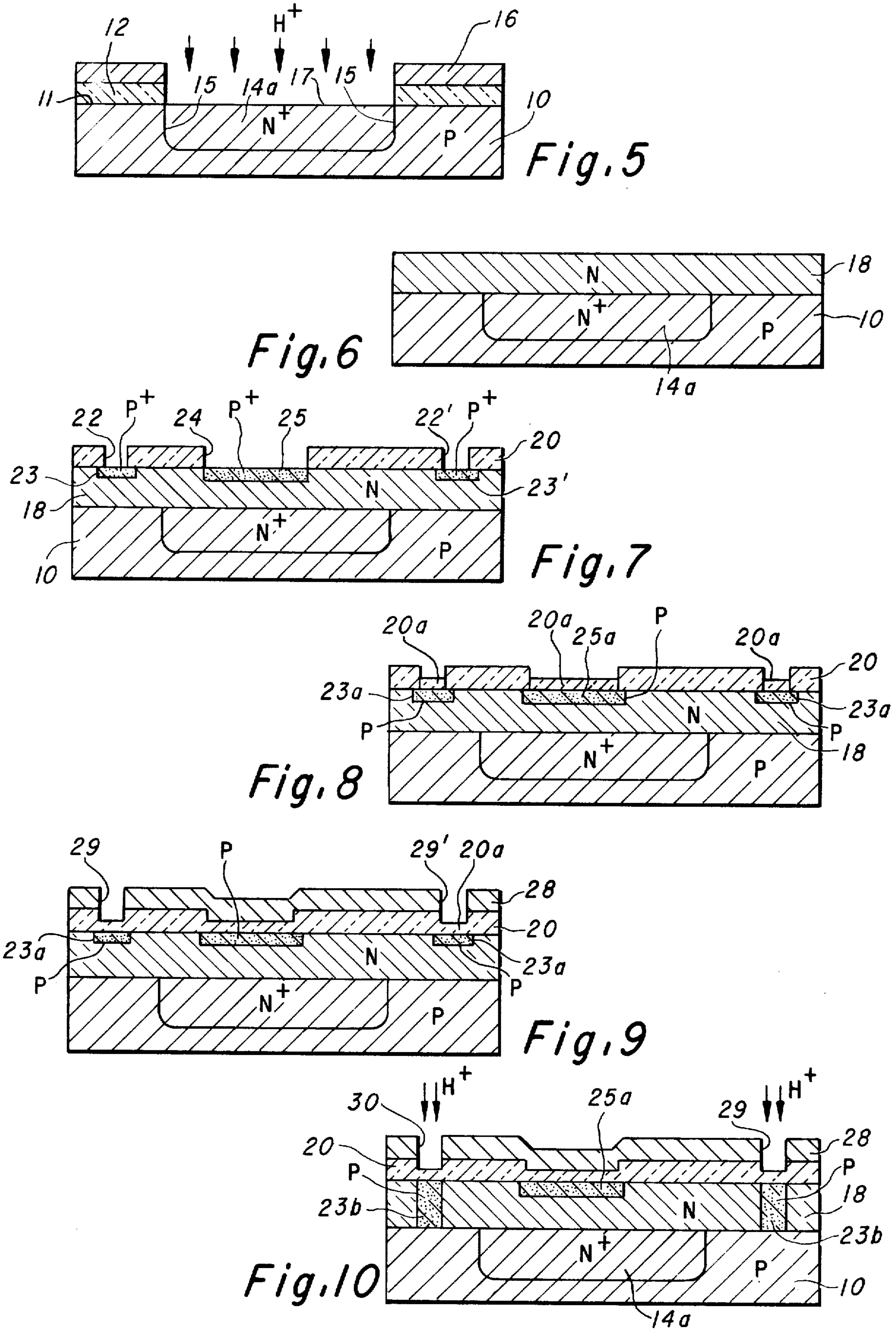

With reference to FIG. 7, a passivating layer 20 (for example, silicon oxide) is formed to overlie the epitaxial layer 18. The oxide layer may, for example, be formed by thermal oxidation, pyrolytic or plasma decomposition. Openings 22–22' and 24 are formed in the oxide layer 20 and a p-type dopant such as boron is deposited through these openings. Opening 22–22' may, for example, comprise an annular region enclosing the area overlying the n-type region 14*a*. The p-type region 23–23' forms an electrical isolation barrier and the p-type region 25 subsequently forms the base of the npn transistor.

Using conventional thermal diffusion techniques, the p-type regions 23–23' and 25 are diffused a short distance into the epitaxial layer 18. These p-type regions after thermal diffusion are shown in FIG. 8 as areas 23*a*–23*a*' and 25*a*. The thermal diffusion process produces a passivating oxide layer 20*a* over the windows 22–22' and 24 originally opened in the oxide layer 20.

Referring to FIGS. 9 and 10, a proton retarding metal layer 28 is next deposited over the oxide layers 20 and 20*a* and the window 29–29' is opened through the metal layer 28 at points overlying the p-type regions 23*a*–23*a*'. A proton beam H+ is directed onto the device through window 29–29'. As described previously the proton beam H+ creates vacancies in the crystal lattice of the epitaxial region 18 by dislodging silicon atoms. These vacancies enable the impurities in region 23a–23a' to diffuse in a direction substantially perpendicular to the surface of the epitaxial layer 18. A proton beam of sufficient energy is utilized so that the impurities diffuse through the epitaxial layer 18 and contact the chip 10, forming a co ntinuous region 23*b*–23*b*' of p-type material through the n-type epitaxial layer. As may be seen, the p-type region 25*a* and the n-type region 14*a* are completely enclosed by p-type conductivity material being enclosed on the periphery by p-type regions 23*b*–23*b*' and on the bottom by the p-type conductivity chip 10.

Figures 11, 12, 13, 14, 15:
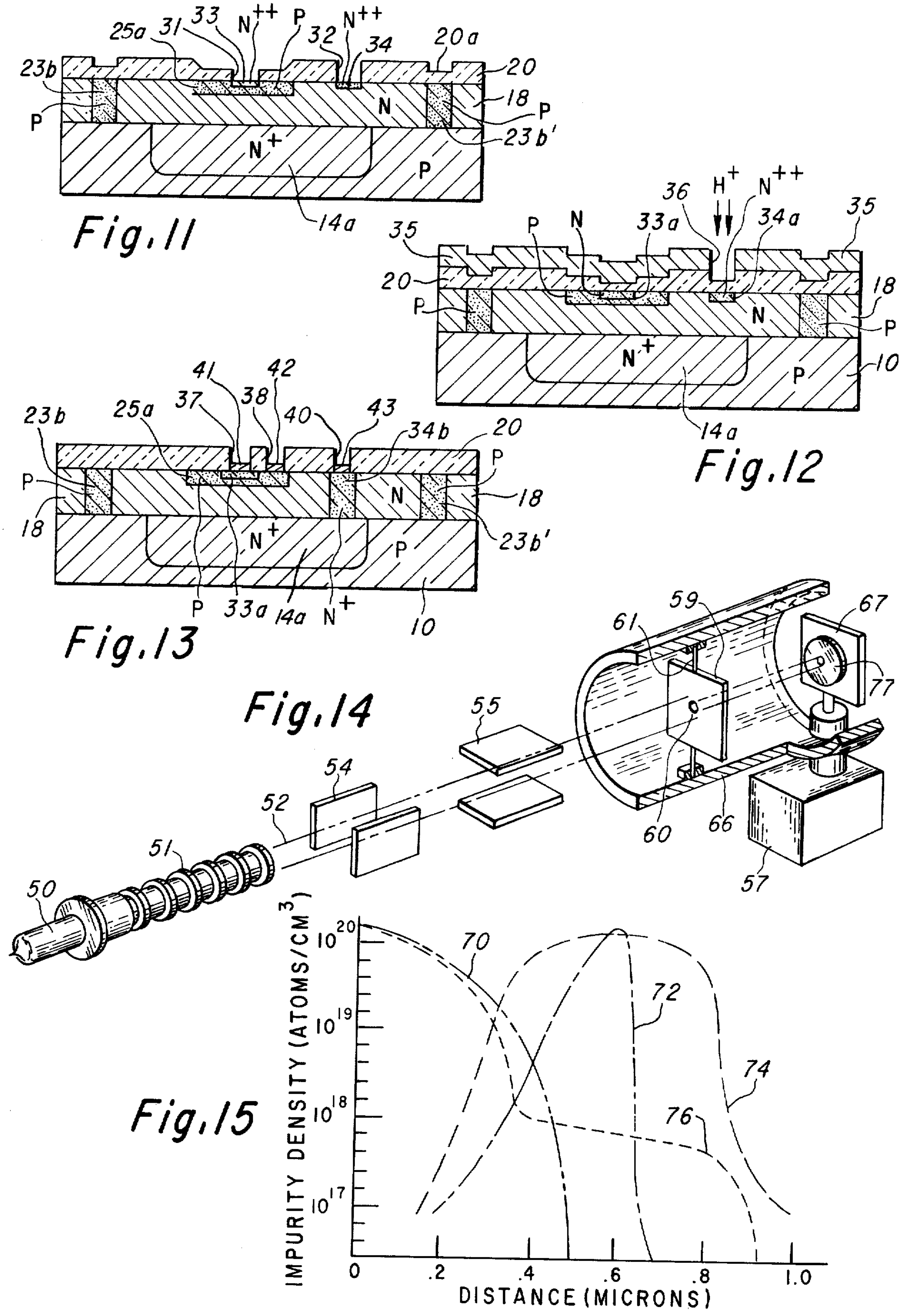
FIG. 14 depicts apparatus by which the method of the present invention may be practised.
FIG. 15 graphically depicts the impurity density profile resulting from proton enhanced diffusion as a function of depth into the substrate.

Referring to FIGS. 11–13, the metal layer 28 is then removed by etching techniques known to those in the art and windows 31 and 32 are opened in the oxide layer 20 and 20*a*. Window 31 is formed to overlie a portion of p-type region 25*a* and window 32 is formed to overlie a region of the epitaxial layer 18 that overlies region 14*a* and that is intermediate the p-type region 25*a* and the electrical isolation barrier 23*b*–23*b*'. An n-type impurity, for example, phosphorus or arsenic, is deposited through the windows 31 and 32 to form n-type conductivity regions 33 and 34. Region 33 forms the emitter of the npn transistor and region 34 forms the collector contact region. Again, conventional thermal diffusion techniques are used to diffuse the n-type conductivity regions 33 and 34 a shallow distance into p-type regions 25*a* and into the epitaxial layer 18 respectively. During this thermal diffusion, an oxide layer is formed over the area opened by windows 31 and 32. The n-type regions 33 and 34 after thermal diffusion are shown in FIG. 12 as regions 33*a* and 34*a*.

A proton retarding metal film 35 is then formed over the oxide layer 20 and a window 36 is opened to expose a region of the oxide layer 20 that overlies n-type region 34*a*. At this juncture it should be noted that while a metal region such as shown at 35 will retard proton penetration, the oxide layer such as 20 does not retard the protons. The device is bombarded with protons H+ through window 36 enabling the impurities in the region 34*a* to diffuse in a direction substantially perpendicular to the surface of the epitaxial layer 18 and contact the n-type conductivity region 14*a* in the chip 10. This region is shown as 34*b* in FIG. 13. The n-type dopant used to form region 34*b* makes that region N+ with respect to the epitaxial layer 18. Region 14*a* is also N+ with respect to the epitaxial layer 18.

The metal film 35 is removed in accordance with conventional techniques leaving oxide layer 20 overlying the epitaxial region 18 and doped regions 23*b*–23*b*', 34*b*, 25*a*, and 33*a*. Windows 37, 38 and 40 are opened in the oxide layer 20 to expose respectively the surface of the doped regions 33*a*, 25*a*, and 34*b*. Ohmic contacts are then deposited through said windows to form contacts 41, 42 and 43. Contact 41 is the emitter contact of the npn transistor; contact 42 is the base contact; and contact 43 is the collector contact. The device at this stage of fabrication is shown in FIG. 13 and depicts an essentially completed npn device operable in an integrated circuit. As may be seen, the device is fully electrically isolated from other devices that may be formed on the chip 10 by the junction formed between the p-type regions 23*b*–23*b*' and adjacent n-type material.

With reference to FIG. 14, there is depicted therein apparatus by which the proton enhanced diffusion steps of the present invention may be practised. The apparatus basically comprises a proton source 50 mounted at one end of an accelerator tube 51. From the accelerator tube, protons in the form of a beam 52 emerge and pass through a deflection system which may be comprised of horizontal scanner plates 54 and vertical scanner plates 55. This deflection system is used to direct the beam such that it is focused on a plate 59 which has a suitably dimensioned aperture 60 therein. This plate is rigidly held in an evacuated chamber 66 between the slice 77 and the proton source 50 by a suitable fixture 61. The sample holder 67 upon which the slice 77 is mounted is fixed to an indexing assembly 57 which moves the assembly such that only one portion of the surface of the slice 77 is exposed to the beam which is passing through the aperture 60. As previously mentioned, the semiconductor slice 77 may consist of a large number of chips such as chip 10 described above.

The indexing system in conjunction with the aperture permits precise control of the proton beam, enabling bombardment of discrete selected areas of the surface of the slice 77. Such control assures that when the proton current passing through the aperture and impinging on the slice is maintained constant, each irradiated portion of the slice receives exactly the same intensity of radiation. Alternatively, the current passing through the aperture may be integrated using a commercially available electrometer device and the slice indexed after a predetermined charge is impinged upon the specified area of the slice's surface.

The proton source 50 and accelerator tube 51 may comprise a relatively high energy proton accelerator from about 50,000 volts to several million electron volts.

With reference to FIG. 15, the advantages of using proton bombardment in accordance with the invention to effect deep diffusion in an integrated circuit device as described above may better be understood. FIG. 15 is a graph of dopant concentration in atoms per cubic centimetre along the vertical axis vs. the distance in micrometers from the surface of the material being bombarded. The curve 70 depicts the conventional impurity profile obtained by conventional thermal diffusion. For example, when the material is silicon and the impurity is boron introduced by conventional thermal diffusions, the boron doped layer that results is about 0.5 μm deep. Curve 72 depicts the number of vacancies produced by bombarding silicon material with proton beams of relatively low energy, for example, about 50 KEV. Using such a level of proton energy, the maximum number of vacancies is produced at about 0.6 μm depth and tapers off sharply. The vacancies so produced diffuse a certain distance through the material, producing a region in the material having a large number of vacancies. This region is enclosed by curve 74. As the impurities diffuse from vacancy to vacancy, a relatively sharp junction will be produced. The impurity profile after the proton enhanced diffusion of the boron is depicted by curve 76. As may be seen, proton bombardment enhances diffusion of the impurity into the material.

In forming an isolation region around a circuit element of an integrated circuit, the semiconductor material could be doped by conventional techniques with an impurity such as boron, producing in the region surrounding the circuit element a gradient of impurities in the semiconductor material similar to that shown by curve 70. If it is desired, for example, to cause the boron to diffuse to a depth of about 1.0 μm into the semiconductor, thermal diffusion techniques would require subjecting the device to about 1200°C for a long period of time, deleteriously affecting the characteristics of the device. Using proton enhanced diffusion, however, high temperatures are not required. In fact, at temperatures less than 1000°C, and preferably about 450° – 700°C, the rate of diffusion obtained by proton enhancement is comparable to that obtained by thermal diffusion at 1200°C. Using a proton beam energy of about 50 KEV, the boron will diffuse into the silicon about 0.9 μm as shown by the curve 76. Using a sufficiently high energy proton beam, the impurities may be diffused through the semiconductor and form an isolation barrier around the circuit element.

By varying the energy of the proton beam, the depth of diffusion of impurities into the semiconductor material may be controlled. A more detailed description relative to the effects of proton bombardment on the diffusion rates of boron in silicon may be found in Nelson et al, "Radiation-Enhanced Diffusion of Boron in Silicon," Applied Physics Letters, Vol. XV, No. 8, Oct. 15, 1969, pages 246 to 248.

It will be appreciated that a method according to the invention has general application to enhancement of impurity diffusion into a semiconductor material in forming an isolated region in structure. an integrated circuit structure, In relation to the provision of an isolated region as described above, the prior provision of a buried region is not an essential feature. In addition, active and passive circuit elements in general, can be formed within the isolated region.

What is claimed is:

1. A method for electrically isolating a selected region of an epitaxial layer in an integrated circuit structure having a substrate of one type conductivity and an epitaxial layer of opposite type conductivity formed thereupon, comprising the steps of:

a. doping a selected surface area of said epitaxial layer surrounding the selected region thereof to be electrically isolated with an impurity introduced a relatively short distance into said epitaxial layer to produce a shallow region of the same conductivity type as said substrate and spaced from said substrate by a major portion of the thickness of said epitaxial layer; and b. selectively bombarding said doped selected surface area with protons to enhance diffusion of said impurity through the thickness of said epitaxial layer to form a continuous doped region extending through said epitaxial layer to said substrate, the periphery of said continuous doped region forming a boundary through said epitaxial layer that is substantially perpendicular to the surface thereof in which the doping of the selected surface area occured, the said bombarding being effected while maintaining the integrated circuit structure at a temperature below about 1000°C.

2. A method for electrically isolating a selected region of an epitaxial layer in an integrated circuit structure having a substrate of one type conductivity and an epitaxial layer of opposite type conductivity formed thereupon, comprising the steps of:

a. doping a selected area of said substrate with an impurity introduced a relatively short distance into said substrate to produce a shallow doped region therein of said opposite type conductivity;

b. selectively bombarding said selected surface area of said substrate with protons to enhance diffusion of said impurity therein thereby increasing the depth of said doped region within said substrate;

c. depositing an epitaxial layer of semiconductor material over said substrate and said doped region therein, said epitaxial layer having the said opposite type conductivity;

d. doping a selected surface area of said epitaxial layer surrounding the selected region thereof to be electrically isolated and overlying an area outside of and surrounding the periphery of said doped region in said substrate with an impurity introduced a relatively short distance into said epitaxial layer to produce a shallow region of the same conductivity type as said substrate and spaced from said substrate by a major portion of the thickness of said epitaxial layer; and e. selectively bombarding said doped selected surface area of said epitaxial layer with protons to enhance diffusion of the said impurity therein through the thicknesss of said epitaxial layer to form a continuous doped region extending through said epitaxial layer to said substrate, the periphery of said continuous doped region forming a boundary through said epitaxial layer that is substantially perpendicular to the surface thereof in which the doping of the selected surface area occurred, the said bombarding being effected while maintaining the integrated circuit structure at a temperature below about 1000°C.

3. A method according to claim 2 wherein the electrically isolated region of the epitaxial layer forms the collector region or a transistor, the base and emitter regions being formed within the said collector region.

4. A method of forming a transistor in an integrated circuit including the steps of:

a. doping a selected surface area of a monocrystalline semiconductor substrate having a conductivity of one type with an impurity introduced a relatively short distance into said substrate to produce a shallow doped region within said substrate having an opposite type conductivity;

b. selectively bombarding said selected surface area of said substrate with protons to enhance diffusion of said impurity therein thereby increasing the depth of said doped region of said opposite conductivity type within said substrate;

c. depositing an epitaxial layer of semiconductor material over said substrate and said doped region therein, said epitaxial layer having the said opposite type conductivity;

d. simultaneously doping selected surface areas of said epitaxial layer with impurities introduced relatively short distances therein to produce shallow regions within said epitaxial layer having the said one type conductivity and spaced from said substrate by a major portion of the thickness of said epitaxial layer thereby to form respectively the base region of the transistor and a second region destined to be an electrical isolation region, said base region overlying a portion of said doped region in said substrate, said second region surrounding an area destined to be the transistor and including the base region, and said second region also overlying an area outside of and surrounding the periphery of said doped region in said substrate;

e. selectively bombarding said second region with protons to enhance diffusion of the said impurity therein through the thickness of said epitaxial layer to form a continuous doped isolation region extending through said epitaxial layer to said substrate thereby forming an electrical isolation barrier of the said one type conductivity around said base region and said doped region in said substrate;

f. simultaneously doping a surface area of said base region and a surface area of said epitaxial layer intermediate said base region and said isolation region and also overlying a portion of said doped region in said substrate with impurities to produce regions of said opposite type conductivity, thereby forming respectively the emitter and collector contact regions of said transistor;

g. selectively bombarding said collector contact region with protons to enhance diffusion of the said impurity therein through the thickness of said epitaxial layer to form a continuous doped region therethrough, said continuous doped region contacting a portion of said doped region in said substrate; and h. forming ohmic contacts to said base and emitter regions and to said collector contact region, thereby producing a transistor operable in an integrated circuit.

5. A method according to claim 4 wherein said substrate is comprised of silicon doped with boron; wherein said epitaxial layer is n-type silicon; and wherein said emitter and collector contact regions are formed by doping said surface area of said base region and said surface area of said epitaxial layer intermediate said base region and said isolation region with phosphorus or arsenic.

6. A method according to claim 4 wherein the proton bombardment steps are effected while maintaining the integrated circuit structure at a temperature in the range of 450°C – 700°C.

* * * * *